United States Patent [19]

Scifres et al.

[11] 4,023,993

[45] May 17, 1977

[54] METHOD OF MAKING AN ELECTRICALLY PUMPED SOLID-STATE DISTRIBUTED FEEDBACK LASER

[75] Inventors: Donald R. Scifres, Los Altos; William Streifer, Palo Alto; Robert D. Burnham, Los Altos Hills, all of Calif.

[73] Assignee: Xerox Corporation, Stamford, Conn.

[22] Filed: Aug. 28, 1975

[21] Appl. No.: 608,425

Related U.S. Application Data

[62] Division of Ser. No. 499,671, Aug. 22, 1974.

[52] U.S. Cl. ............................... 148/172; 148/171; 148/187; 148/188; 148/1.5; 331/94.5 H; 357/18; 357/16; 148/33.5

[51] Int. Cl.² ................ H01L 21/208; H05B 33/00

[58] Field of Search .............. 331/94.5 H; 148/171, 148/188, 172, 187, 1.5, 33.5; 357/18, 16

[56] References Cited

UNITED STATES PATENTS

| | | | |
|---|---|---|---|
| 3,691,476 | 9/1972 | Hayashi | 331/94.5 H |
| 3,758,875 | 9/1973 | Hayashi | 331/94.5 H |
| 3,824,493 | 7/1974 | Hakki | 331/94.5 H |
| 3,838,359 | 9/1974 | Hakki et al. | 331/94.5 H |
| 3,849,790 | 11/1974 | Gottsmann et al. | 357/18 |
| 3,859,178 | 1/1975 | Logan et al. | 148/172 X |
| 3,868,589 | 2/1975 | Wang | 331/94.5 H |

OTHER PUBLICATIONS

Nakamura et al., *Applied Physics Letters*, vol. 25, No. 9, Nov. 1974, pp. 487 and 488.

*Primary Examiner*—G. Ozaki
*Attorney, Agent, or Firm*—J. E. Beck; T. J. Anderson; L. Zalman

[57] ABSTRACT

An electrically pumped, solid-state laser device having a grating or physical periodic structure in a region, or adjacent a region, of semiconductor material that functions as a light wave guide. The spacing of the perturbations of the periodic structure are selected to be an integer number of half wavelengths of the desired laser wavelength. The electrically pumped, solid-state laser device can be a single heterojunction device or a double heterojunction device. Both devices are formed by a process which provides for formation of the periodic structure prior to formation of the light guiding layer or region. Due to this process a periodic structure having a desired spacing and substantial depth is produced, which structure produces Bragg Scattering which couples and reinforces light traveling through the light guiding layer in both directions in a coherent manner such that reflections are in phase, thus allowing laser operation in the absence of discrete end reflectors.

7 Claims, 15 Drawing Figures

METHOD OF MAKING AN ELECTRICALLY PUMPED SOLID-STATE DISTRIBUTED FEEDBACK LASER

This is a division of application Ser. No. 499,671, filed Aug. 22, 1974.

BACKGROUND OF THE INVENTION

Recent developments in optical fibers and materials with low transmission losses have enhanced the attractiveness of integrated optical circuits. Although these circuits can be realized as discrete components, the advantage of integrating devices in solid-state systems is widely appreciated. Such solid-state systems will require a solid-state, electrically excited, laser light source to produce a high intensity, coherent light beam.

Solid-state laser devices having either planar or cleaved end mirrors or other external mirrors are not suitable for integrated structures. Generally, the mirrors are displaced from each other by a very large multiple of half wavelengths, for example, thousands of half wavelengths. Thus, the mirrors can reinforce light of many different wavelengths thereby making it very difficult to provide good frequency selectivity and stability. Further, lasers having cleaved or external end mirrors may require higher threshold current densities which act to decrease operating life.

Recently, interest has been focused upon distributed feedback lasers. These structures do not utilize the conventional cavity end mirrors, but instead provide feed-back by means of Bragg Scattering from periodic perturbations of the refractive index and/or gain of the laser medium itself. Distributed feedback lasers are compact and provide a high degree of frequency selectivity. However, as yet no one has successfully applied this distributed feedback concept to obtain oscillations in electrically pumped solid-state lasers. If such a laser was capable of 300° Kelvin (room temperature) operation, it could become the primary light source for proposed integrated optical circuits.

State-of-the-art distributed feedback solid-state and solid-dye lasers utilize optical pumping and thus require an independent light source. Such an independent pumping source, which itself can be a laser device, and its associated focusing optics, are hard to align properly for the desired impingement, and, obviously, a separate laser pumping source is not compatible with an integrated optical circuit.

It is an object of the present invention to provide a method of making an improved electrically pumped solid-state laser device.

It is a further object of the present invention to provide an improved method of making an electrically pumped single heterojunction distributed feedback laser device.

It is still further object of the present invention to provide an improved method of making an electrically pumped, double heterojunction distributed feedback laser device.

SUMMARY OF THE INVENTION

The invention relates to an electrically pumped, solid-state laser device having a grating or physical periodic structure in a region, or adjacent to a region, of semiconductor material that acts as a light wave guide. The spacing of the perturbations of the periodic structure are selected to be an integer number of half wavelengths of the desired lasing wavelength in the laser. The perturbations significantly interact with a portion of the guided light beam. The electrically pumped, solid-state laser device can be a single heterojunction device or a double heterojunction device. In both the single and double heterojunction devices, perturbations in the concentration of the doping material may possibly act with physical perturbations to enhance the desirable interaction with the guided lightbeam, thereby increasing the Bragg Scattering.

The electrically pumped single heterojunction solid-state laser device is produced in accordance with the invention by a method which provides for formation of the periodic structure prior to formation of the light guiding layer or region. The light guiding layer is formed by a diffusion process. This process is carried out after the formation of the periodic structure and the growth of a GaAlAs layer. The growth is carried out at a low temperature such that there is not appreciable meltback or dissolution of the periodic structure. Thus, a periodic structure having a substantial depth is produced, thereby providing a significant interaction with the laser light beam.

The electrically pumped double heterojunction laser device allows a reduction in the thickness of the light guiding layer due to the relatively low refractive indexes of materials on both sides of the light guiding layer, and hence, a greater interaction between the periodic structure and the laser light in that layer. The interaction may be increased by a periodicity in the doping material which periodicity exists in the light guiding layer in addition to the mechanically formed periodic structure. If present, this increased interaction causes a lower threshold pumping current density to be required, which is believed to increase the device life. Sufficient interaction may be obtainable even with structures which are physically removed from the active region.

DETAILED DESCRIPTION OF THE INVENTION

There will be disclosed hereinafter an electrically pumped, single heterojunction, distributed feedback diode laser and an electrically pumped, double heterojunction, distributed feedback diode laser and their methods of manufacture. It should be noted that the ultimate usefulness of the devices to be discussed may not be in the individual devices but rather in an integrated optical or electro-optical circuit including these devices.

Figure 1:
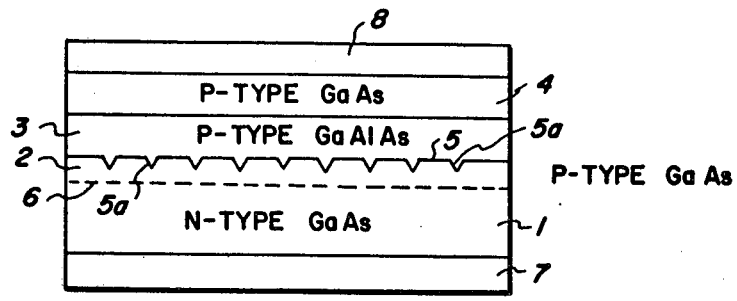
FIG. 1 is a cross-sectional view of a single heterojunction device

Referring now to FIG. 1, there is shown an electrically pumped, single heterojunction, distributed feedback diode laser device according to the invention. Basically, the device consists of an n-type Ga As layer 1, a p-type Ga As layer 2, a p-type Ga Al As layer 3, and a p-type Ga As layer 4. Layer 4 is not essential to the operation of the device but is used for ease in fabrication of electrical contacts. A periodic structure 5, shown in the form of a grating having downwardly extending teeth or channels 5a, exists between the layers 2 and 3. The periodic structure is produced on the top surface of an n-type Ga As substrate (the bulk material of which at that time included the bulk material of layers 1 and 2, as will be described in detail hereinafter) by one of several methods, preferably surface or ion milling, prior to the Ga Al As layer 3 being grown. After growth of layers 3 and 4 and cleaning thereof, the device is placed in a diffusion chamber and a diffusion of the p-type dopant such as Zn through layers 4 and 3 into the n-type Ga As occurs to produce the p-type Ga As layer 2 and the p-n junction 6 between layers 1 and 2. Metal contacts 7 and 8 are affixed to layers 1 and 4, respectively.

Due to its base material (GaAs) and doping concentration, the layer 2 has a band gap of ~1.4 eV, which is slightly lower than the ~1.41 eV band gap of the layer 1 and substantially lower than the ~1.8 eV band gap of layer 3. Also, the ~3.6 refractive index of the layer2 is slightly greater than the ~3.58 refractive index of layer 1 and substantially greater than the ~3.4 refractive index of the layer 3. As is well known, when a forward bias is applied to the p-n junction electrons are injected from layer 1 into layer 2 and are confined to the layer 2 by the potential difference produced by the heterojunction layer 3. With sufficient pump current population inversion is achieved and gain is obtained. Light is produced by radiative recombination of the carriers in this region 2. The light is guided in layer 2 due to the higher refractive index of the region relative to its adjacent layers 1 and 3. Thus, the lasing light is substantially restricted to propagation through layer 2. As will be discussed in detail hereinafter, the inter-action between the lightin layer 2 and the periodic structure 5 produces Bragg Scattering which reinforces and couples light travelling through the layer 2 in both directions in a coherent manner such that the reflections are in phase, thus allowing laser operation in the absence of discrete end reflectors.

Figure 2A:
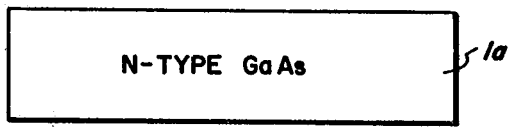
FIGS. 2a through 2g are cross-sectional and perspective views of the device of FIG. 1 during steps of its manufacture.

The method of fabricating the electricallypumped, solid-state distributed feedback diode device of FIG. 1 will now be described in relation to FIG. 2. Fabrication is initiated from a substrate 1a of n-type GaAs having an impurity concentration $N_D$ of about $10^{18}$ cm$^{-3}$, as shown in FIG. 2a. The impurity can be silicon, although other n-type impurities can be used. The lattice orientation of the Ga As substrate 1a is not critical, good results have been achieved using a (100) oriented Ga As substrate, but other orientations, for example, (110) or (111) oriented GaAs should produce good results.

After having been cleaned, such as by an organic solvent and/or by an acid, the periodic structure 5 is formed on the top surface of the substrate 1a. The spacing of the teeth of the periodic structure depends upon the lasing wavelength in the GaAs light guiding layer 2, with such relationship being approximately given by the equation:

$$\Lambda \approx m\lambda/2n$$

where $\Lambda$ is the spacing of the periodic structure, $m$ is Bragg diffraction order which is a small integer, lambda ($\lambda$) is the lasing wavelength in the Ga As layer 2, and $n$ equals the refractive index of the Ga As layer 2. For GaAs, lambda ($\lambda$) equals ~8,500A and $n$ is approximately 3.6 such that $\Lambda$ equals ~1,200A for $m$ equals 1, ~2,400A for $m$ equals 2, ~3,600A for $m$ equals 3, ~4,800A for $m$ equals 4, ~6,000A for $m$ equals 5, and so on.

The production of grafting spacings as small as those indicated require either interferometric exposure of a photo resist material, such as, Shiply AZ 1350 resist, which is laid down on the top surface of substrate 1a in a conventional manner to a depth of approximately 3,600A, or by conventional electron resist techniques. The interferometric exposure technique is conventional and utilizes a beam splitter and two mirrors to direct two laser light beams of equal intensity and equal polarization upon the photo resist with equal angles of incidence. The relationship between the grating spacing and the interferometric exposure is given by the equation:

$$\Lambda = \text{laser}/(2 \sin \Theta 0\ n)$$

where
$\Lambda$ = grating spacing
$\lambda$ = laser wavelength (not to be confused with the diode laser wavelength $\lambda$.)
$\theta$ = the angle between the normal to the substrate surface and the laser beam, and
$n$ = refractive index of the medium surrounding the substrate (air = 1).

Figure 2B:
Figure 2C:
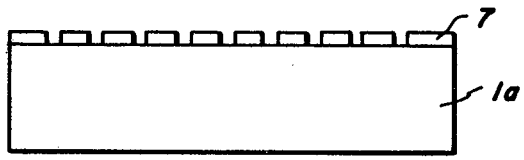

Since an argon laser is generally used for the interferometric pattern formation and the wavelength of available argon lasers is approximately 4579A, the grating spacing $\Lambda$ of 3600A can be achieved by interfering the laser beam at an angle of about 40°. It is also possible to fabricate first and second order gratings by conventional techniques. For third order operation, the interferometric pattern would be adjusted, as is well known in the art, to expose thin strips of the photo resist 7 spaced about 3,600A apart, with each exposed strip about 1800A wide, as depicted in FIG. 2b, wherein the darkened areas of resist layer 7 represent the exposed areas. Once the grating pattern is formed on the resist 7, the resist is developed to leave only the unexposed regions still on the top surface of the substrate 1a, as shown in FIG. 2c.

Figure 2D:
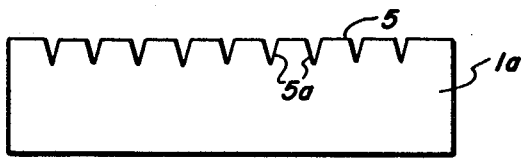
Figure 2E:
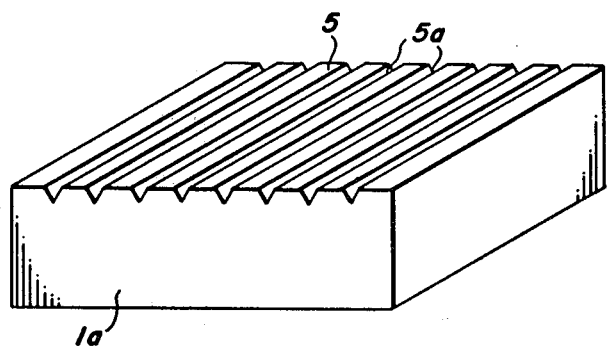

Several possible methods are available for producing the periodic structure in the substrate 1a now partly protected by the resist 7. These methods include ion implantation, ion milling, diffusion, etching or surface milling. It is believed that ion milling produces the best periodic structure. With ion milling, the top surface of substrate 1a is bombarded by argon ions, by other inert ions, with the ion beam potential being about 4,000 volts and the beam current being about 100 microamps. The resist 7 protects the covered portions of substrate 1a, allowing the ion beam to form the teeth or channels 5a in the unprotected areas. It is important that the ion milling process stop when the ion beam has substantially removed most of the resist. If milling persists for too long a period, the grating teeth become narrow and are affected by subsequent process steps. It is also important that the milling be performed at a shallow angle of incidence since pitting of the surface results when the Ar$^+$ beam impinges normal to the plane of the substrate 1a. After the grating has been formed, the remaining photo resist is removed by conventional means, such as by an acetone bath. The depth of the teeth 5a of the grating, which depth is important to the distributed feedback action to be described hereinafter, are about 1250A, but laser operation can be obtained with both shallower and deeper teeth. FIG. 2d is an end view of the substrate 1a with teeth 5a, and FIG. 2e is a perspective view of the device of FIG. 2d.

Figure 2F:
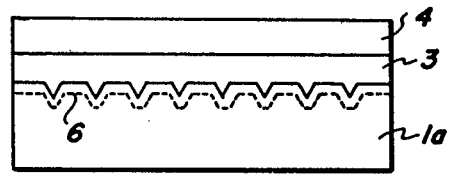

Following cleaning of the substrate, the substrate is placed in a liquid phase epitaxial growth furnace and a p-type $Ga_{1-x} Al_x$ As layer 3 is grown on the corrugated surface, as shown in FIG. 2f. Next, a p-type Ga As layer 4 is grown to facilitate the fabrication of electrical contacts on the device. The thickness of layer 3 is preferably a few microns, having a dopant level of about $10^{18}$ cm$^{-3}$. The formation of layers 3 and 4 are achieved in a conventional manner and with conventional apparatus. It is, however, important that the growth be done at a low temperature, about 800° C, since high temperatures will cause a meltback or dissolution of the periodic structure 5. The concentration of aluminum (x) in the $Ga_{1-x} Al_x$ As is controlled such that the refractive index of the layer 3 is about 3.4 and the band gap is about 1.8 electron volts. As previously explained, these values provide both the required light wave guide structure and the electron confinement. x is 0.3 at the substrate 1a-grown layer 3 interface, but it may vary between nearly 0 to 0.8. It is noted in relation to FIG. 2f that during the growth of layer 3, the p-type dopant diffuses slightly into the As substrate 1a Ga As as depicted by junction 6. It is believed that the diffusion extends about 0.5 microns into substrate 1a.

Figure 2G:
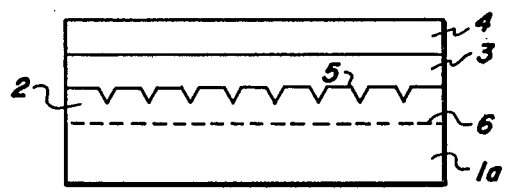

After further cleaning the device of FIG. 2f is placed in an evacuated diffusion ampoule along with zinc arsenide and diffusion is accomplished for approximately 10 minutes at approximately 700° C. This diffusion drives p-type material further into substrate 1a thereby driving the p-n junction 6 further into the substrate 1a to thereby define layer 2, the light guiding layer, as shown in FIG. 2g. The thickness of layer 2 is preferably about 2 microns, although a lesser or greater thickness is possible depending upon the band gap and refractive indicies of layers 1 and 3.

Following removal from the diffusion ampoule, the lower surface of substrate 1 (the part of substrate 12 below the junction 6) is polished to remove any zinc diffused therein, to once again expose n-type GaAs material. In some cases it may be desirable to anneal this wafer to optimize the device performance subsequent to the diffusion. The Ga As layer 4 makes it easier to bond a contact to the top layer of the laser device since, as is well known, it is difficult to bond to an aluminum containing material. Tin and gold are now sputtered onto the n-type substrate 1 and titanium, platinum and gold are sputtered onto the upper surface of layer 4 and then annealed to make n-type and p-type ohmic contacts, respectively, thereby completing the fabrication of the device of FIG. 1. The formation of the contacts is by conventional methods which are not part of applicant's invention.

Figure 3:
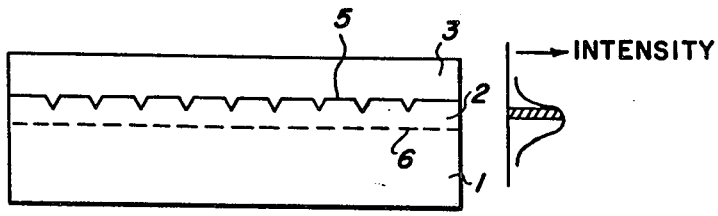
FIG. 3 shows a cross-sectional view of the device of FIG. 1 with light distribution characterized.

As noted, the depth of layer 2 is about 2 microns and the depth of teeth 5a is about 1250A. Due to the refractive index of layers 1 and 3, most of the laser light which is initiated by electrical pumping is confined within layer 2. FIG. 3 shows a symbolic representation of the laser light intensity in layers 1, 2 and 3. As illustrated, the increased depth of teeth 5a and the controlled thickness of layer 2, cause a substantial portion of the light (shown lined) to interact with the teeth or periodic structure. This increased interaction produces increased Bragg Scattering and thereby allows the device to lase at lower threshold current densities. In the case of one diode when a pumping source was coupled to electrode 8, with electrode 7 grounded, which source delivered 0.5 microsecond pulses of ~7 amps and 15 volts, with a pulse delivered every $10^{-3}$ seconds, lasing was observed at threshold current densities as low as 775 Amps/cm$^2$, compared to more than 8400 Amps/cm$^2$ needed to initiate lasing in an otherwise identical single heterojunction semiconductor device without periodic structure or corrugation feedback but with saw cut and/or angle polished end faces.

The light emission spectrum of the distributed feedback laser of the device of FIG. 1 shifts very little in wavelength as a function of current density, even up to five times threshold current. This is in contrast to cleaved mirror lasers. Also, due to the components (teeth) of the periodic structure being only a half wavelength or small multiple thereof apart, the distributed feedback laser of the present invention has good frequency stability which is not greatly affected by the length of the laser.

Figure 4:
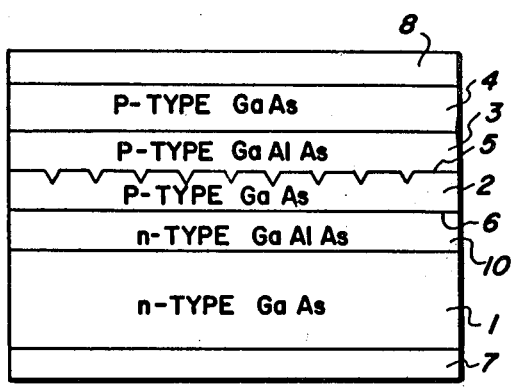
FIG. 4 is a cross-sectional view of a double heterojunction device.

Referring now to FIG. 4, there is shown a double heterojunction diode laser in accordance with the invention. This device differs from the device of FIG. 1, by the addition of an n-type $Ga_{1-x} Al_x$ As layer 10 between layers 1 and 2. The layer 10 has a lower refractive index, about 3.4 and a higher band gap, about 1.8 eV than layer 2, the former of which can be varied in accordance with concentration (x) of the aluminum. This provides a better light guiding and current confining for layer 2 since it is sandwiched between two layers that have both a substantially higher band gap, there now being a difference in refractive index between the light guide layer 2 and the adjacent layers 3 and 10 of 0.2, and a difference in band gap of about 0.4 electron volts as opposed to a difference of 0.2 electron volts between layers 11 and 2 of the device of FIG. 1. Because of the greater difference in refractive index and band gap, layer 2 can be made very thin, for example, about 0.5 microns thick or less as opposed to 2 microns thick for the single heterojunction device of FIG. 1. With the layer 2 thinner, and with the teeth of the periodic structure 5 extending significantly downward, that is about 1250A, there is increased interaction between the guided laser beam in layer 2 and the periodic structure and hence increased Bragg Scattering. This increase in Bragg Scattering allows for lower threshold pumping current densities which may increase device usefulness and lifetime even more than the device of FIG. 1.

Figure 5:
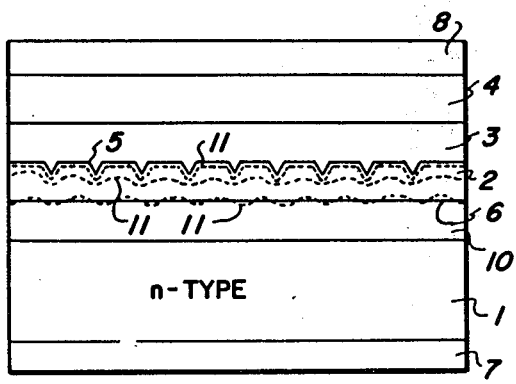
FIG. 5 is a cross-sectional view of the device of FIG. 4 showing equi-level dopant lines.

In addition to the interaction between the physically formed periodic structure 5 and the light in the guiding layer 2, there is also believed to be interaction between the guided light and a dopant produced periodic structure. This can best be explained in relation to FIG. 5 wherein the dotted lines 11 in layer 2 represent equi-level dopant concentrations. As shown, the equi-level dopant concentrations produce a periodic dopant structure which extends further into the layer 2 than the mechanical periodic structure 5. The equi-level dopant concentration lines 11 have greater amplitude near granting 5, that is, vary greater and appear more like the grating 5 nearer to the grating 5, becoming substantially flat near the p-n junction 6. It is believed that the periodic structure of the equi-level dopant lines causes further Bragg Scattering of the guided laser light beam in layer 2 and hence lasing at even lower threshold pumping current densities.

Formation of the periodic structure in layer 2 may cause some damage to the GaAs material of layer 2. Since the layer 2 is very thin in the double heterojunction laser device, the light amplitude in the device of FIG. 5 extends outwardly from layer 2. Since a significant portion of the light transverses areas of layers 3 and 10, it is possible to have the periodic structure in these layers as shown by periodic structures 12 and 14 in FIG. 6. The periodic structures 12, 14 and 15 could have the same spacing as the periodic structure 5 or a different spacing if a different Bragg order is to be utilized or a different laser material is used.

The device of FIG. 4 is formed by growing on (n-type GaAs) layer 1 an n-type GaAlAs layer 10, with a doping concentration $N_D$ of $\sim 10^{18}/cm^3$. Thereafter, layer 2 is grown atop layer 10 and is doped p-type with Ge or is left undoped. In the case of an undoped layer 2 there would be some impurity left from the growing of layer 10 and layer 2 would have some impurity therein, approximately $10^{17}/cm^3$. The grating 5 would then be formed atop layer 2 as previously described in relation to FIG. 1. P-type GaAlAs layer 3 is then grown on layer 2 with a diffusable dopant such as zinc or cadmium being used if a larger coupling is necessary. The contacts 7 and 8 are formed in a conventional manner as previously described in relation to FIG. 1. Layer 10 is preferably 1 $\mu$ thick, layer 2 is preferably 0.1 to 0.5 $\mu$ thick, and layer 3 is preferably 1 $\mu$ thick.

Figure 6:
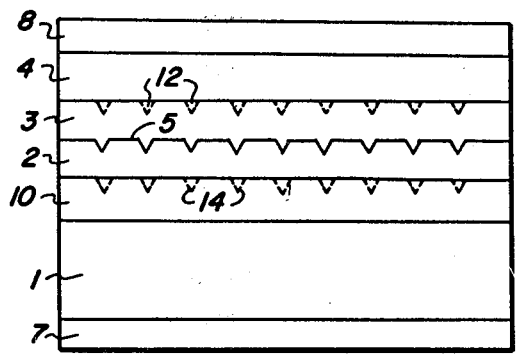
FIG. 6 is a cross-sectional view of a further embodiment of a double heterojunction device.
Figure 7:
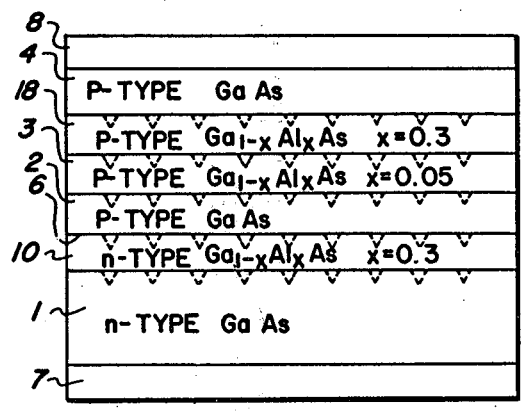
FIG. 7 is a cross-sectional view of a further embodiment of a dual heterojunction device.

In the case of various geometries described in FIG. 6, fabrication would follow the logical sequence outlined for the two previously described geometries. Other geometries are also possible. For example, it may be advantageous to add an additional layer 18 of GaAlAs as done in "large optical cavity (LOC)" lasers. FIG. 7 shows such a structure with aluminum concentrations indicated. The grating may be placed in several positions in this device. Such a structure may provide increased coupling or ease of fabrication over a regular double heterostructure.

Figure 1A:
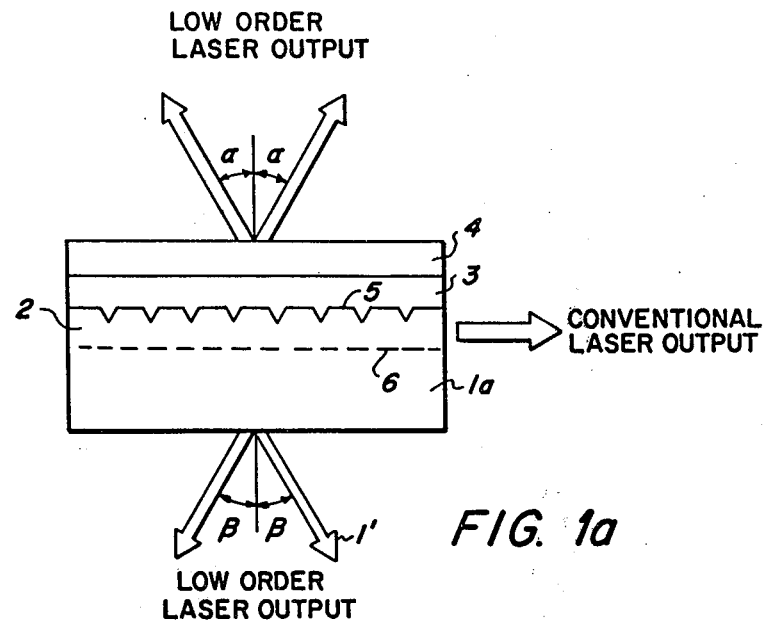
FIGS. 1a and 1b show the light output of the light guiding layer of the device of FIG. 1.

FIG. 1a depicts the light output for the device of FIG. 1, with the light output of the double heterojunction device being similar. In this figure, the conventional laser output is emitted from the end of light guiding layer 2. This output is produced by 3rd order Bragg scattering of the grating. Due to the interaction of the grating with the lasing light, light is scattered by lower order Bragg reflections when the spacing of the grating is chosen to principally operate with 3rd order Bragg scattering. This lower order light passes through the top and bottom surfaces of the device in a collimated beam as also shown in FIG. 1a.

The lower order light is highly collimated and thus the lower order light has superior coupling characteristic with fiber optics, superior utility for point-to-point communications, and is superior for other applications for which highly collimated light is desired.

Figure 1B:
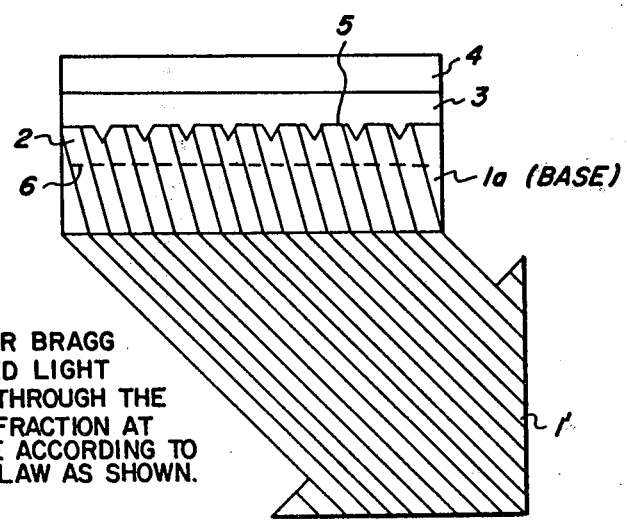

The lower order light output will have a different angle or to the normal to the top and bottom surfaces due to the different refractive indicies of the materials on either side of the light guiding layer. It may be necessary in certain instances to coat the surface of the device with an anti reflection coating to allow these beams to escape from the device and not be totally internally reflected. FIG. 1b depicts all the multiplicities of parallel light beams that comprise the low order light beam 1' shown in FIG. 1a. The other lower order light beams are also comprised of a multiplicity of parallel light beams as shown for beam 1'.

It should be noted also that a 2nd order Bragg grating will produce 1st order output in this fashion and higher order grating will produce other lower order Bragg laser output.

Although the descriptions above are given of devices without cleaved end faces or other external reflectors, all realizaton of the device described herein can be fabricated with cleaves and/or reflectors.

What is claimed is:

1. A method of making an electrically pumped, distributed feedback, solid-state laser device comprising the steps of:
   forming a periodic structure having a regular repetition rate in a first layer of doped semiconductor material,
   forming a second layer of semiconductor material on said first layer, said first layer having a higher refractive index then said second layer,
   forming a p-n junction in said first layer, said second layer and said p-n junction defining a light guiding layer, and
   providing electrical contacts for said laser device such that when said device is forward biased carriers are injected across said p-n junction into said light guiding layer to initiate the production of lasing light.

2. The method of claim 2 wherein said periodic structure is formed at an interface between said light guiding layer and an adjacent layer.

3. The method of claim 2 wherein said second layer is grown and said p-n junction is produced by a diffusion process.

4. A method of making an electrically pumped, solid-state laser device comprising:
   forming a periodic structure having a regular repetition rate on a surface of a body of semiconductor material,
   forming a plurality of layers of semiconductor material on said periodic structure with one of said layers being sandwiched between layers of material having a lower index of refraction than the material of said one layer, such that said one layer can act as a light waveguide, and with said one layer having a doping type different than the doping type of one of said sandwiching layers such that a surface of said one layer is bounded by a p-n junction, and
   providing electrical contacts for said laser device such that when said device is forward biased carriers are injected across said p-n junction into said light waveguide layer to initiate the production of light which interacts with said periodic structure, said periodic structure providing light reflections which are in phase whereby laser operation is achieved.

5. The method of claim 4 in which said plurality of layers of semiconductor material is formed at a temperature which does not cause substantial dissolution of said periodic structure.

6. A method of making an electrically pumped, solid-state laser device comprising:
   forming a plurality of layers of semiconductor material on a surface of a body of semiconductor material, one of said layers being sandwiched between layers of material having a lower index of refraction than the material of said one layer such that said one layer can act as a light waveguide, said one layer having a doping type different than the doping type of one of said sandwiching layers such that a surface of said one layer is bounded by a p-n junction, forming a periodic structure having a regular repetition rate on a surface of one of said plurality of layers, forming at least one additional layer of semiconductor material on said periodic structure, and providing electrical contacts for said laser device such that when said device is forward biased carriers are injected across said p-n junction into said light waveguide layer to initiate the production of light which interacts with said periodic structure, said periodic structure providing light reflections which are in phase whereby laser operation is achieved.

7. The method of claim 6 in which said at least one additional layer is formed at a temperature which does not cause substantial dissolution of said periodic structure.

* * * * *

UNITED STATES PATENT AND TRADEMARK OFFICE
CERTIFICATE OF CORRECTION

PATENT NO. : 4,023,993

DATED : May 17, 1977

INVENTOR(S) : Donald R. Scifres, William Streifer, Robert D. Burnham

It is certified that error appears in the above-identified patent and that said Letters Patent are hereby corrected as shown below:

Column 2, line 17, change "growthis" to --growth is--.

line 46, change "deviceof" to --device of--.

Column 3, line 43, change "lightin" to --light in--.

Column 4, line 10, change "grafting" to --grating--.

Column 5, line 61, change "applicant's" to --applicants'--.

Column 6, line 41, change "11" to --1--.

Column 7, line 13, change "12, 14 and 15" to --12 and 14--.

Signed and Sealed this

Twenty-seventh Day of September 197

[SEAL]

Attest:

RUTH C. MASON
Attesting Officer

LUTRELLE F. PARKER
Acting Commissioner of Patents and Trademark